ABSTRACT

United States Patent [19]

Ohbayashi et al.

[11] Patent Number: 4,608,333

[45] Date of Patent: Aug. 26, 1986

[54] RADIATION SENSITIVE POLYMER COMPOSITION

[75] Inventors: Gentaro Ohbayashi, Kusatsu; Susumu Umemoto, Yokohama; Hiroo Hiramoto, Otsu, all of Japan

[73] Assignee: Toray Industries, Inc., Tokyo, Japan

[21] Appl. No.: 579,008

[22] Filed: Feb. 10, 1984

[30] Foreign Application Priority Data

Mar. 3, 1983 [JP] Japan .................................. 58-34907
Aug. 19, 1983 [JP] Japan .............................. 58-150296

[51] Int. Cl.$^4$ ........................... G03C 1/70; C08F 8/00; C08F 2/46
[52] U.S. Cl. .................................. 430/281; 430/196; 430/197; 430/919; 430/906; 525/426; 522/63; 522/65; 522/28
[58] Field of Search ............... 430/196, 197, 281, 282, 430/919, 906; 525/426; 204/159.15, 159.23; 522/63, 65, 28

[56] References Cited

U.S. PATENT DOCUMENTS

| | | | |
|---|---|---|---|
| 3,623,870 | 11/1971 | Curran et al. | 96/49 |
| 3,661,588 | 5/1972 | Chang | 204/159.23 X |
| 3,759,807 | 9/1973 | Osborn et al. | 204/159.23 |
| 3,926,640 | 12/1975 | Rosen | 204/159.23 X |
| 3,957,512 | 5/1976 | Kleeburg et al. | 96/35.1 |
| 4,040,831 | 8/1977 | Rubner et al. | 430/283 |
| 4,243,743 | 1/1981 | Hiramoto et al. | 430/281 X |
| 4,383,903 | 5/1983 | Ayano et al. | 430/196 X |
| 4,451,551 | 5/1984 | Kataoka et al. | 430/920 X |

FOREIGN PATENT DOCUMENTS 0065352 11/1982 European Pat. Off. ............ 430/281

OTHER PUBLICATIONS

C. G. Roffey, *Photopolymerization of Surface Coatings*, (John Wiley & Sons Ltd., 1982, New York, N.Y.), pp. 72-74, 85-89, 130-136.

*Primary Examiner*—John E. Kittle
*Assistant Examiner*—Cynthia Hamilton
*Attorney, Agent, or Firm*—Birch, Stewart, Kolasch & Birch

[57] ABSTRACT

A radiation-sensitive composition is described, which is comprised of (1) a polymer containing repeating units of the formula:

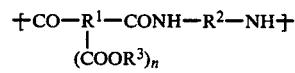

wherein $R^1$ is a trivalent or tetravalent aromatic or heteroaromatic residue having 6 to 30 carbon atoms, $R^2$ is a divalent aromatic or heteroaromatic residue having 6 to 30 carbon atoms, $R^3$ is hydrogen or an ammonium ion, n is 1 or 2, and $COOR^3$ is located in an ortho or peri position with respect to the amide linkage, (2) an organic compound having a radiation-dimerizable or radiation-polymerizable olefinic double bond and an amino radical or a quaternary ammonium salt, and (3) an aromatic secondary or tertiary amine compound which is chemically inactive to actinic radiation. This composition has an improved photo-sensitivity or radiation sensitivity and can give highly heat-resistant relief patterns with a good edge sharpness and good mechanical and chemical properties as well as good insulating properties. Heat-resistant relief patterns obtained from this composition are especially useful as insulating, passivating or protective coatings in semiconductor devices.

23 Claims, No Drawings

RADIATION SENSITIVE POLYMER COMPOSITION

BACKGROUND OF THE INVENTION (1) Field of the Invention

This invention relates to an improved radiation-sensitive polymer composition which can give highly heat-resistant relief structures.

(2) Description of the Prior Art

Photosensitive polymer compositions, used to form heat-resistant relief patterns, are known as shown in the following patent references:
- (a) U.S. Pat. No. 3,623,870 to Curran et al issued on Nov. 30, 1971,
- (b) U.S. Pat. No. 3,957,512 to Kleeberg et al issued on May 18, 1976,
- (c) U.S. Pat. No. 4,040,831 to Rubner et al issued on Aug. 9, 1977, and
- (d) U.S. Pat. No. 4,243,743 to Hiramoto et al issued on Jan. 6, 1981.

According to each of these conventional techniques, a varnish formed by dissolving a photosensitive polymer composition in an appropriate organic solvent is coated and dried on a substrate, and the coating is irradiated with ultraviolet rays through an appropriate photomask and is then subjected to developing and rinsing treatments to obtain an intended relief pattern.

A patterned coating of a polyimide precursor is subjected to an appropriate heat treatment to be thereby converted into a polyimide coating exhibiting heat resistance.

Patterning of these known compositions can be accomplished directly by irradiation with light. However, the composition disclosed in the patent reference (a) has poor stability. Thus, the composition should be used just after mixing of a polyamide acid with dichromic acid, and hence, industrial utilization of this composition is considerably limited. Moreover, since inorganic ions are present in the patterned film formed from this composition, the patterned film cannot be used in the field of semiconductors where the reliability is seriously influenced by the presence of inorganic ions.

In each of the compositions disclosed in the patent references (b) and (c), the constituent polymer is mainly formed by reacting a compound having a photosensitive group and a dibasic acid chloride group with a diamine, and the steps of forming this polymer are complicated. Furthermore, since the chlorine ion generated by dehydrochlorination is left in the film, there is a risk of having bad influences on the reliability in the field of semiconductors.

The composition disclosed in the patent reference (d) is improved over the above-mentioned compositions in that it has an excellent sensitivity to light or radiation, and is obtained according to a simple method comprising mixing a polymer having poly (amic acid) as a main constituent with an amine compound having an olefinic double bond and an amino group or quaternary salt thereof. However, this composition has a limited commercial value because the light exposure time necessary for obtaining a good relief pattern is too long and therefore, the composition is not applicable to a modern process.

SUMMARY OF THE INVENTION

It is a primary object of this invention to provide a polymer composition which comprises a precursor of a heat resistant polymer and has an improved radiation-sensitivity.

Another object of this invention to provide a polymer composition which comprises a precursor of a heat resistant polymer and has an improved sensitivity to light having relatively long wavelengths.

More specifically, in accordance with this invention, there is provided a radiation-sensitive composition comprising:

(1) a polymer [I] containing repeating units represented by the following formula (A):

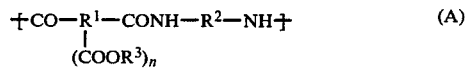

wherein $R^1$ is a trivalent or tetravalent aromatic or heteroaromatic residue having 6 to 30 carbon atoms, $R^2$ is a divalent aromatic or heteroaromatic residue having 6 to 30 carbon atoms, $R^3$ is a hydrogen atom or an ammonium ion, and n is an integer of 1 or 2, and $COOR^3$ is located in an ortho or peri position with respect to the amide linkage, (2) an organic compound [II] having a radiation-dimerizable or radiation-polymerizable olefinic double bond and an amino radical or a quaternary ammonium salt, and (3) an aromatic secondary or tertiary amine compound [III] which is chemically inactive to actinic radiation.

In accordance with a preferred embodiment of this invention, an aromatic azide or sulfonylazide compound may further be incorporated in the above composition.

DETAILED DESCRIPTION OF THE PREFERRED EMBODIMENTS

The polymer having repeating units of the formula (A) is a polymer having a structure represented by the above general formula (A), which is converted by heating or in the presence of an appropriate catalyst to a heat-resistant polymer having an imide ring or other cyclic structure.

In the above-mentioned formula (A), $R^1$ is a trivalent or tetravalent aromatic or heteroaromatic residue having 6 to 30 carbon atoms. A tetravalent aromatic or hetero-aromatic residue is preferred as $R^1$ from the viewpoint of the heat resistance of the resulting polyimide.

As preferred examples of $R^1$, there can be mentioned aromatic residues such as a benzene residue, a naphthalene residue and a biphenyl compound residue of the following formula:

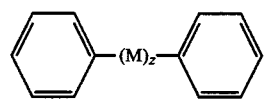

wherein
M is —O—, —SO$_2$—, —CH$_2$—,

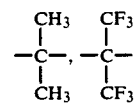

or —CO— and
z is an integer of 0 or 1.

Especially preferred examples of R¹ are

and

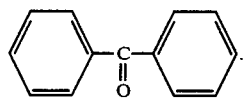

As another preferred example of R¹, there can be mentioned a heteroaromatic residue such as a pyrazine residue.

The polymer [I] containing repeating units (A) may be either a polymer containing one kind of R¹ as mentioned above or a polymer containing two or more kinds of R¹ in the molecule.

R² is a divalent aromatic or hetero-aromatic residue having 6 to 30 carbon atoms.

As preferred examples of R², there can be mentioned as a benzene residue a biphenyl compound residue of the following formula:

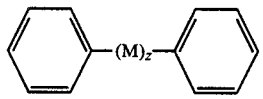

wherein
M is —O—, —SO$_2$—, —CH$_2$—,

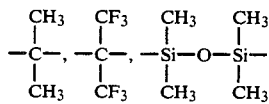

or —CO— and z is an integer of 0 or 1, and a polyphenyl compound residue of the following formula:

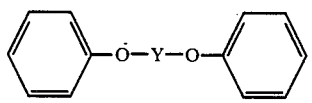

wherein
Y is

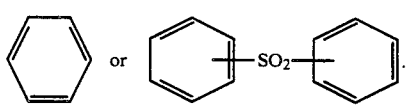

As another preferred example of R², there can be mentioned a heteroaromatic residue such as that of the following formula:

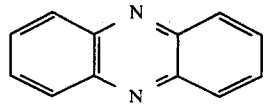

The benzene ring of R² may contain substituents such as, for example, an amino group, an amide group, a carboxyl group, a sulfonic acid group and a sulfonamide group, so long as these substituents give no bad effect on the heat resistance of the resulting polyimide. As preferred examples of R² containing a substituent, there can be mentioned

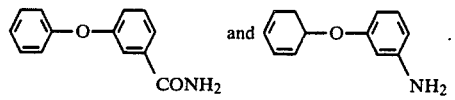

Especially preferred examples of R² are

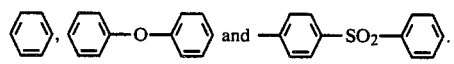

The polymer [I] containing repeating units (A) may be either a polymer containing one kind of R² as mentioned above or a copolymer containing two or more kinds of R² in the molecule. In the copolymer, at least one kind of the repeating units may contain as R² an unsubstituted divalent aromatic or heteroaromatic residue and at least one kind of the repeating units may contain as R² a substituted divalent aromatic or heteroaromatic residue.

R³ is hydrogen or a substituted or unsubstituted quaternary ammonium ion.

Incidentally, in the formula (A), the group (COOR³)$_n$ should be located at an ortho-position or peri-position with respect to the amide linkage.

Furthermore, the polymer may contain a small proportion of an aliphatic divalent group having a siloxane structure as R², so long as the heat resistance of the resulting polyimide is not significantly degraded. A typical instance of this aliphatic divalent group is as follows:

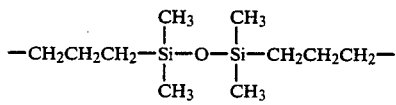

The polymer [I] having repeating units (A) may be prepared by the reaction between a dianhydride and a diamine. Preferred examples of the polymer [I] include a reaction product between pyromellitic dianhydride and 4,4'-diaminodiphenyl ether, a reaction product of pyromellitic dianhydride and 3,3',4,4'-benzophenonetetracarboxylic dianhydride with 4,4'-diaminodiphenyl ether, a reaction product between 3,3',4,4'-benzophenone-tetracarboxylic dianhydride and 4,4'-diaminodiphenyl ether, a reaction product between 3,3',4,4'-biphenyltetracarboxylic dianhydride and 4,4'-diaminodiphenyl ether, a reaction product of 3,3',4,4'-biphenyltetracarboxylic dianhydride and 3,3',4,4'-benzophenone-tetracarboxylic dianhydride with 4,4'-diaminodiphenyl ether, a reaction product between pyromellitic dianhydride and 3,3'- or 4,4'-diaminodiphenylsulfone, a reaction product of pyromellitic dianhydride and 3,3',4,4'-benzophenone-tetracarboxylic dianhydride with 3,3'- or 4,4'-diaminodiphenylsulfone, a reaction product between 3,3',4,4'-benzophenone-tetracarboxylic dianhydride and 3,3'- or 4,4'-diaminodiphenylsulfone, a reaction product between 3,3',4,4'-biphenyltetracarboxylic dianhydride and 3,3'- or 4,4'-diaminodiphenylsulfone, a reaction product of 3,3',4,4'-biphenyltetracarboxylic dianhydride and 3,3',4,4'-benzophenone-tetracarboxylic dianhydride with 3,3'- or 4,4'-diaminodiphenylsulfone, a reaction product of pyromellitic dianhydride with 4,4'-diaminodiphenylether and bis(3-aminopropyl)tetramethyldisiloxane, a reaction product of pyromellitic dianhydride and 3,3',4,4'-benzophenone-tetracarboxylic dianhydride with 4,4'-diaminodiphenyl ether and bis(3-aminopropyl)tetramethyldisiloxane, a reaction product of 3,3',4,4'-benzophenone-tetracarboxylic dianhydride with 4,4'-diaminodiphenyl ether and bis(3-aminopropyl)tetramethyldisiloxane, a reaction product of 3,3',4,4'-biphenyltetracarboxylic dianhydride with 4,4'-diaminodiphenyl ether and bis(3-aminopropyl)tetramethyldisiloxane, a reaction product of 3,3',4,4'-biphenyltetracarboxylic dianhydride and 3,3',4,4'-benzophenone-tetracarboxylic dianhydride with 4,4'-diaminodiphenyl ether and bis(3-aminopropyl)tetramethylsiloxane, a reaction product of pyromellitic dianhydride with 3,3'- or 4,4'-diaminodiphenylsulfone and bis(3-aminopropyl)tetramethyldisiloxane, a reaction product of pyromellitic dianhydride and 3,3',4,4'-benzophenone-tetracarboxylic dianhydride with 3,3'- or 4,4'-diaminodiphenylsulfone and bis(3-aminopropyl)tetramethyldisiloxane, a reaction product of 3,3',4,4'-benzophenonetetracarboxylic dianhydride with 3,3'- or 4,4'-diaminodiphenylsulfone and bis(3-aminopropyl)tetramethyldisiloxane, a reaction product of 3,3',4,4'-biphenyltetracarboxylic dianhydride with 3,3'- or 4,4'-diaminodiphenylsulfone and bis(3-aminopropyl)tetramethyldisiloxane, and a reaction product of 3,3',-4,4'-biphenyltetracarboxylic dianhydride and 3,3',4,4'-benzophenone-tetracarboxylic dianhydride with 3,3'- or 4,4'-diaminodiphenylsulfone and bis(3-aminopropyl)tetramethyldisiloxane.

The polymer [I] is either a homopolymer or copolymer derived only from repeating units of the above formula (A), or a copolymer of repeating units of the formula (A) and other repeating units (B). In case of the latter-mentioned copolymer, in order to achieve the objects of this invention, the other repeating units (B) are preferably selected from those which do not significantly degrade the thermostability of the resulting polyimide derived from the polymer [I] by heat curing. An example of the copolymer comprised of repeating units (A) and (B) is poly(amide amic acid). Preferred examples of the other repeating units (B) are those represented by the following formula:

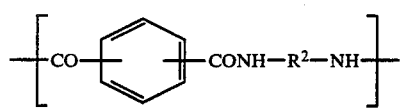

wherein $R^2$ is a divalent organic group having at least 2 carbon atoms, preferred examples of which are selected from those mentioned with respect to $R^2$ in the formula (A).

The organic compound [II] has a radiation-dimerizable or radiation-polymerizable olefinic double bond and an amino radical or a quaternary ammonium salt.

The following compounds [II-a] through [II-d] can be mentioned as typical examples of the organic compound [II].

[II-a]

A compound represented by the following formula:

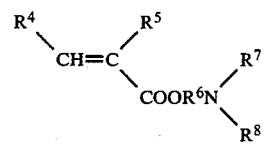

wherein $R^4$ is hydrogen or a phenyl group, $R^5$ is hydrogen or an alkyl group having 1 to 2 carbon atoms, $R^6$ is an alkylene group having 2 to 12 carbon atoms, and each of $R^7$ and $R^8$ is an alkyl group having 1 to 6 carbon atoms.

[II-b]

A compound represented by the following formula:

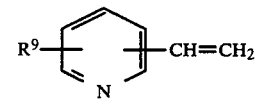

wherein $R^9$ is hydrogen or an alkyl group having 1 to 6 carbon atoms.

[II-c]

A compound represented by the following formula:

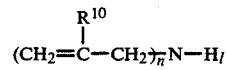

wherein $R^{10}$ is hydrogen or a methyl group, n is an integer of from 1 to 3, and the sum of l and n is 3.

[II-d]

Quaternary salts of the foregoing compounds and mixtures thereof.

Other examples of the compound [II] are 2-vinylquinoline, 4-vinylquinoline, allyltriethylammonium chloride, 1-allylimidazole, 2-isopropenylimidazole, 1-vinylimidazole, 1-methallylimidazole, 1-allylbenzimidazole, 2-vinylimidazole, 1-methallylbenzimidazole, 1-vinylpyrazole, 1-allylpyrazole, 1-methallylpyrazole, 1-vinylpyrole, 2-methyl-5-vinylpyrole, 2-morpholinoethylacrylate and 4,6-dimethyl-2-vinylpyridine.

Preferred examples of the organic compound [II] are diethylaminoethyl methacrylate, diethylaminoethyl acrylate, dimethylaminoethyl methacrylate, dimethylaminoethyl acrylate, 2-vinylpyridine, 2-methyl-5-vinylpyridine, allylamine and methallylamine. From the viewpoint of the photosensitivity, acrylic esters or methacrylic esters are especially preferable.

In the case of a compound [II] having an amino group and an olefinic double bond, it is desirable to combine the compound [II] with a polymer [I] in which $R^3$ of the repeating units (A) is hydrogen. In the case of a compound [II] having a quaternary ammonium salt and an olefinic double bond, it is desirable to combine the compound [II] with a polymer [I] in which $R^3$ of the repeating units (A) is an ammonium ion.

The ratio of the compound [II] to the polymer [I] preferably meets the following conditions:
(1) The mol ratio of the compound [II] to the repeating units of the polymer [I] is preferably equal to or greater than 0.05, more preferably equal to or greater than 0.3.
(2) The mol ratio of the compound [II] to $COOR^3$ in the polymer [I] is preferably equal to or less than 2.0.

The compositions which satisfy these conditions have a better radiation sensitivity and are highly responsive to development.

When the compound [II] is used in combination with a monomer copolymerizable therewith, such as monomaleimide, polymaleimide or a substitution product thereof, the radiation sensitivity is improved and better results are obtained.

The aromatic secondary or tertiary amine compound [III] is a compound which is chemically inactive with respect to actinic radiation to a level adopted to achieve the objects of this invention. The compound [III] is free of a substituent having a dimerizable or polymerizable olefinic double bond. The aromatic ring of the compound [III] attached to the amino radical is not conjugated with a ketonic carbonyl group if such a group is present in the molecule of the compound [III].

The compound [III] is an aromatic secondary or tertiary amine compound which has an amino group bonded directly to the aromatic ring and at least one hydrogen atom of the amino group is substituted with a substituted or unsubstituted alkyl group.

Preferred examples of the aromatic ring are a benzene ring, a naphthalene ring or a ring of a biphenyl compound represented by the following formula:

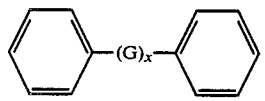

wherein G is —O—, —SO$_2$—, —CH$_2$— or the like, and x is 0 or 1.

The aromatic ring may be substituted with a radiation-inactive group such as an alkyl group, an alkoxy group, a halogen atom or a hydroxyl group. The aromatic ring has ordinarily 6 to 30 carbon atoms and preferably 6 to 15 carbon atoms.

The alkyl group bonded to the amino group may be linear or a ring containing the nitrogen atom of the amino group (the ring may further contain a hetero atom such as oxygen, sulfur or nitrogen in the ring). The alkyl group may have a polar substituent. The alkyl group has ordinarily 1 to 12 carbon atoms and preferably 1 to 6 carbon atoms.

As preferred examples of the amino compound [III], there can be mentioned N-phenylethylamine, N-phenyldiethylamine, N-phenyl-N-ethylbenzylamine, N-phenylmorpholine, 3-ethylamino-p-cresol, N-phenyl-N-(2-cyanoethyl)ethylamine, N-phenylethanolamine, N-phenyl-N-methylethanolamine, N-phenyl-N-ethylethanolamine, N-phenyldiethanolamine, N-(3-methylphenyl)diethanolamine, N-(4-methylphenyl)diethanolamine and N-phenyldiisopropanolamine.

Of aromatic secondary or tertiary amino compounds having an amino group to which an alkyl group is bonded, those having a polar substituent on the alkyl group are preferred. Amino compounds having a hydroxyl group as the polar substituent, that is, aromatic amino compounds in which at least one hydrogen atom of the amino group is substituted by an alkyl group having a hydroxyl group, are most preferred. As examples of the most preferred aromatic amino compounds, there can be mentioned N-phenylethanolamine, N-phenyl-N-methylethanolamine, N-phenyl-N-ethylethanolamine, N-phenyldiethanolamine, N-(3-methylphenyl)diethanolamine and N-(4-methylphenyl)diethanolamine.

It is preferred that the compound [III] be incorporated in an amount of at least 0.1% by weight, more preferably 0.5 to 20% by weight, based on the weight of the polymer [I]. If the amount of the compound [III] incorporated in the composition is outside this range, the photosensitivity is degraded and the allowable ranges of the development conditions such as the development time and temperature are narrowed.

The radiation-sensitive composition of this invention is ordinarily used in the form of a solution. Typically, the solution is prepared according to the following process.

A polymer [I] having repeating units of the formula (A) is prepared by reacting a diamine with a dianhydride of a tetracarboxylic acid in a suitable organic solvent. A compound [II] is mixed into the polymer solution. Then, a compound [III] dissolved in a suitable amount of the solvent is mixed into the solution. The so-obtained solution of the radiation-sensitive composition may be diluted so that the desired viscosity is obtained, and be filtered.

In the case of a polymer [I] in which n in the general formula (A) is 1, the solution of the photo- or radiation-sensitive composition of this invention is similarly obtained by mixing a compound [II] in a solution of the polymer [I] and dissolving a compound [III] in the solution.

Typical examples of solvents that can be used for preparing the polymer [I] are N-methyl-2-pyrrolidone, N,N-dimethylformamide, N,N-dimethylacetamide, dimethylsulfoxide, hexamethylphosphoramide, γ-butyrolactone, ethyleneglycol monomethyl ether and ethyleneglycol monoethyl ether. These solvents may be used alone or in the form of mixtures of two or more of them.

Typical solvents that can be used for diluting the photo- or radiation-sensitive composition are the same as those mentioned above with respect to the preparation of the polymer [I]. These solvents may be used alone or in the form of mixtures of two or more of them.

The radiaton sensitivity of the composition of this invention may further be improved by adding an aromatic azide compound [IV] or aromatic sulfonylazide compound [V] described hereinafter.

Typically, the azide compound [IV] or [V] is dissolved together with the compound [III] in the course of the preparation of the solution of the composition of this invention.

The aromatic azide compound [IV] is a compound having an azide group (N$_3$-) bonded directly to an aromatic ring. As the aromatic ring, there can be mentioned a benzene ring, a naphthalene ring, an anthrathene ring, a naphthoquinone ring and an anthraquinone ring. The aromatic ring may be substituted with a lower alkyl group, a lower alkoxy group, a lower carboxyalkyl group, a nitro group, a halogen group or the like. Furthermore, the aromatic ring may be bonded to another substituted or unsubstituted aromatic ring through a divalent group such as —O—,

—SO₂—, —CH₂— or

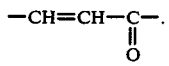

The aromatic azide compound [IV] has ordinarily 6 to 30 carbon atoms and preferably 6 to 21 carbon atoms. The azide compound [IV] may have one azide group in the molecule (hereinafter referred to as "aromatic monoazide compound") or may be a compound in which two aromatic rings having an azide group are bonded to each other through a bridging group such as mentioned above and hence, two azide groups are contained in the molecule (hereinafter referred to as "aromatic bisazide compound").

Preferred instances of the aromatic monoazide compound are as follows:

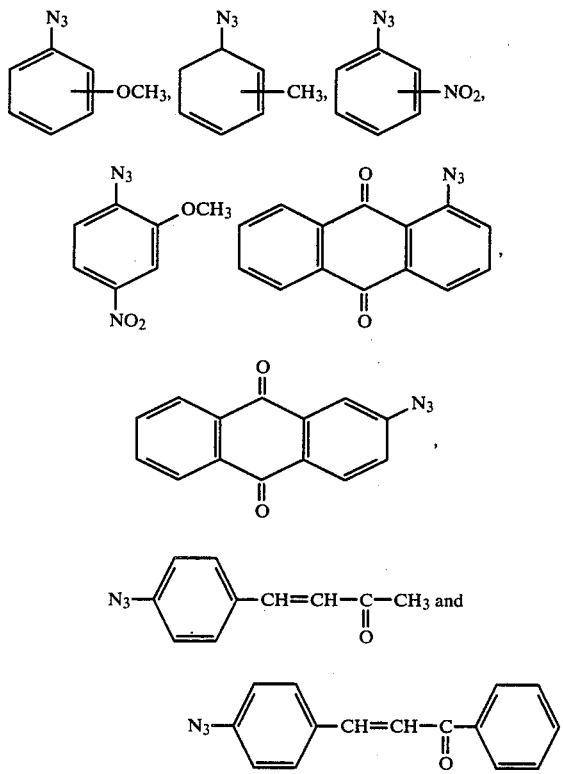

Preferred examples of the aromatic bisazide compound are as follows:

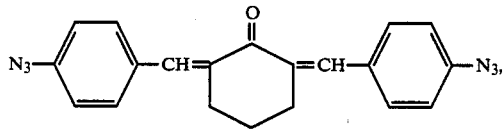

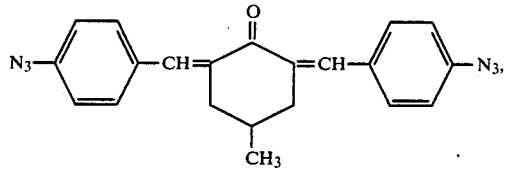

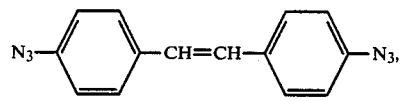

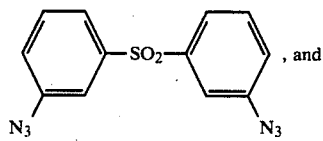

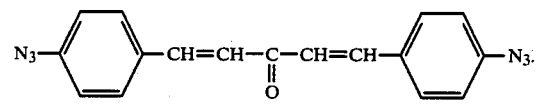

Aromatic azide compounds that can be used in the present invention are not limited to those exemplified above.

In view of the solubility, the ease of selection of the sensitive wavelength region and the ease of preparation, an aromatic monoazide compound is most preferred.

It is preferred that the aromatic azide compound [IV] be added in an amount of at least 0.1% by weight based on the weight of the polymer [I] having the repeating units (A) as the main units, especially 0.5 to 30% by weight based on the weight of the polymer [I]. If the amount of the aromatic azide compound [IV] is outside the above-mentioned range, the developing property or storage stability is often adversely affected.

The foregoing aromatic azide compounds [IV] may be used alone or in the form of mixtures of two or more of them.

The aromatic sulfonylazide compound [V] is a compound in which a sulfonylazide group is directly bonded to an aromatic ring.

As the aromatic ring, there can be mentioned a benzene ring, a naphthalene ring and other fused rings. The aromatic ring may be substituted with a substituent such as a lower alkyl group having 1 to 6 carbon atoms, an alkoxy group, a carboxyalkyl group, a nitro group, a halogen atom, a carboxyl group, a carboxyl ester group or a secondary or tertiary amino group. The aromatic ring may be bonded to another unsubstituted aromatic ring or another aromatic ring substituted with a substituent such as mentioned above through a divalent group such as —O—,

—SO₂—, —CH₂—, —CH=CH—,

—CH=CH—C— or —C—CH=CH—.
              ‖          ‖
              O          O

The aromatic sulfonylazide compound [V] has ordinarily 6 to 30 carbon atoms and preferably 6 to 21 carbon atoms.

Preferred examples of the aromatic sulfonylazide compound [V] are as follows:

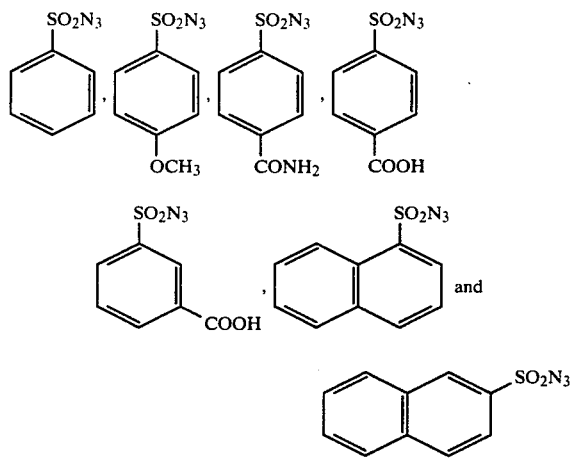

Aromatic sulfonylazide compounds [V] that can be used in this invention are not limited to those exemplified above.

It is preferred that the aromatic sulfonylazide compound [V] be used in an amount of at least 0.1% by weight, more preferably 0.5 to 30% by weight, based on the weight of the polymer [I] having the repeating units (A) as the main units. If the amount of the aromatic sulfonylazide compound [V] used is outside the above range, the developing property or stability of the composition is often adversely affected.

The compounds [V] may be used alone or in the form of mixtures of two or more of them. The compound [V] may also be used in combination with the compound [IV].

Other additives such as a sensitizer, a copolymerizable monomer and an agent for improving the adhesion to a substrate may be incorporated, so long as the sensitivity of the composition and the heat resistance of the resulting polyimide are not significantly degraded.

When the amount of the compound [III] incorporated is 0.5 to 10% by weight, Michler's ketone or 4,4'-bis(diethylamino)benzophenone is preferably used as the sensitizer. By incorporation of the sensitizing agent, the radiation sensitivity of the composition of this invention can further be improved.

In the process for applying the composition of this invention to a substrate, the composition is applied by adopting such means as spin coating using a spinner, immersion coating, spray coating, printing or the like, and the composition is then dried at about 30 to about 100° C. for about 10 minutes to about 5 hours to form a film. The thickness of the so-formed film can be controlled according to the coating technique or by controlling the solid content or viscosity of the solution of the composition or other means.

The film is then exposed imagewise to actinic radiation. Typical actinic radiation sources used are ultraviolet lamps providing radiations having a wavelength of 200 to 500 nanometers. Other actinic radiation such as visible rays, X-rays and electron beams can also be used. Ultraviolet rays and visible rays having a relatively short wavelength, that is, 300 to 500 nm, are preferred.

After the exposure, the film is developed into a relief pattern with a developer which dissolves the unexposed portions.

An example of the developer is a mixture of a solvent for the composition and a non-solvent for the composition. As the solvent, there can be mentioned N,N-dimethylformamide, N,N-dimethylacetamide, N-methylpyrrolidone, dimethylsulfoxide and hexamethylphosphoramide. As the non-solvent, there can be mentioned methanol, ethanol, Carbitol (diethylene glycol ethyl ether), water and Methyl Cellosolve (ethylene glycol monomethyl ether).

Another example of the developer is an aqueous alkaline solution such as an aqueous solution of ammonia, sodium hydroxide or potassium hydroxide. Still other examples of the developer include solvents used for formation of solutions of the composition of this invention, such as mentioned hereinbefore.

Development is accomplished by spraying a developer such as mentioned above onto the surface of the coated film, or by dipping the coated film in the developer optionally under ultrasonic agitation.

In this invention, it is preferred that the relief pattern formed be the development by rinsed with a rinsing solution to remove the developer. Preferred examples of the rinsing liquid are methanol, ethanol, isopropyl alcohol and butyl acetate.

The relief pattern thus obtained is cured by baking at about 200° to about 400° C. for about 20 minutes to about 4 hours to form a pattern of a highly thermally stable polymer having a heat-stable imide or other ring structure.

As the substrate to which the solution of the composition of this invention is applied, there can be mentioned, for example, metals, glasses, semiconductors, metal oxide insulators (e.g., $TiO_2$, $Ta_2O_5$ and $SiO_2$) and silicon nitride.

A common adhesion promotor may optionally be used so as to improve the adhesion between the substrate and the coating of the composition of this invention or the polyimide film formed by the heat treatment.

As the adhesion promoter, there are preferably used organic silicon compounds such as hydroxypropyltrimethoxysilane, γ-glycidoxypropyltrimethoxysilane, γ-aminopropyltriethoxysilane and γ-methacryloxypropyltrimethoxysilane, aluminum chelate compounds such as aluminum monoethylacetoacetate diisopropylate, aluminum tris(ethylacetoacetate) and aluminum tris(acetylacetate), and titanium chelate compounds such as titanium bis(acetylacetate).

Thus, the radiation-sensitive composition of this invention can be used for the preparation of passivating layers or insulating layers on semiconductor devices, the preparation of a soldering protective film for a printed circuit, the preparation of an orientation-controlling film for a liquid crystal display device, the preparation of masks for ion implantation or vapor deposition of metals or inorganic compounds which need high temperature vaporization, and the preparation of lift-off patterns. Furthermore, the composition can be used as a dry etching-resistant photoresist and a radiation-sensitive resist.

The radiation sensitivity of the composition of this invention is evaluated according to the well-known step tablet method using Kodak No. 2 step tablet (manufactured by Eastman Kodak Co.). More specifically, a film of the composition on a substrate is exposed to ultraviolet rays through the step tablet and then, development is carried out. The step number at which the film is left with a minimum light quantity is checked. In this step tablet, as the step number is increased by 1, the quantity of transmitted light is reduced to $1/\sqrt{2}$ of the quantity at the preceding step number. Accordingly, the larger is the step number, the higher is the sensitivity.

As is apparent from the foregoing description, the photo- or radiation-sensitive composition of this invention comprises a polymer [I] having repeating units (A) as the main units, a compound [II] containing an unsaturated bond dimerizable or polymerizable with actinic radiation and an amino group or a quaternary salt thereof and an aromatic secondary or tertiary amine compound [III]. According to this invention, the sensitivity is greatly improved over the sensitivities of compositions comprising known sensitizers, though the functional mechanism of attaining this unexpected effect has not been elucidated.

Furthermore, if an aromatic azide compound, preferably an aromatic monoazide compound, or an aromatic sulfonylazide compound is added to the composition of this invention comprising a polymer [I] having repeating units (A) as the main units, a compound [II] and a compound [III], the sensitivity is further improved, and, if an azide compound sensitive to light having a long wavelength is selected, there can be attained an effect of expanding the sensitive wavelength region.

Moreover, the composition of this invention is advantageous in that a film of the composition of this invention can be exposed imagewise by a step-and-repeat type exposure apparatus using light having a wavelength of 436 nm and the imagewise exposure can be completed within a reasonable time.

Still further, the composition of this invention is stable under storage conditions adopted for heat-resistant polymer precursor solutions of this type, for example, polyimide precursor solutions.

By the term "heat resistance" used herein, it is meant that even if a formed relief pattern is heated at 200° C. in a nitrogen atmosphere for 1 hour, the relief pattern does not become obscure or any significant loss in the weight of the relief pattern by heating is not caused.

This invention will now be described in detail with reference to the following examples that by no means limit the scope of the invention.

EXAMPLE 1

In 600 g of N-methyl-2-pyrrolidone was dissolved 68 g of diaminodiphenyl ether to form an amine solution. Then, 108 g of benzophenone-tetracarboxylic dianhydride was dispersed in the solution, and reaction was carried out at 50° C. for 3 hours to obtain a polymer solution (A) having a viscosity of 20 poise as measured at 30° C.

Then, 40 g of the solution (A) was mixed with 5.6 g of diethylaminoethyl methacrylate. A solution of 0.6 g of N-phenyldiethanolamine in 4.5 g of N-methylpyrrolidone was added to the mixture, and the mixture was then filtered.

The obtained solution was spin-coated on a silicon wafer by a spinner and then dried at 80° C. for 1 hour to obtain a film having a thickness of 5 μm. The coating film was flat and even and adhered tightly to the substrate. A mask having a stripe pattern was closely applied to the film and the assembly was irradiated with ultraviolet rays by using a 200-W high pressure mercury lamp for 2 seconds. The ultraviolet ray intensity on the exposed surface was 10 mW/cm² at a wavelength of 365 nm. Namely, the exposure quantity was 20 mJ/cm². After the exposure, development was carried out with a mixed solvent comprising dimethylacetamide (5 parts) and methanol (2 parts), followed by a rinsing treatment with isopropanol, whereby a relief pattern was obtained. This pattern had a sharp side wall and the thickness was 3.5 μm. In conventional compositions, an exposure quantity of several hundred mJ/cm² was necessary for obtaining a good pattern. On the other hand, in case of the composition of this invention, a good pattern was obtained with such a small exposure quantity as 20 mJ/cm². Therefore, it was confirmed that the composition of this invention had an excellent sensitivity. When this pattern was heat-treated at 350° C. for 30 minutes, a heat-resistant relief pattern was obtained. When this pattern was heat-treated at 200° C. for 1 hour, the pattern did not become obscure or a loss in weight was not observed.

COMPARATIVE EXAMPLE 1

The polymer solution (A) (40 g) obtained in Example 1 was mixed with a solution of a variable amount of Michler's ketone and 5.6 g of diethylaminoethyl methacrylate in 4.5 g of N-methylpyrrolidone, and the mixture was filtered. The obtained composition was tested in the same manner as described in Example 1. When the test was carried out by adjusting the amount of Michler's ketone in the range of from 0.009 g to 0.9 g, it was found that the sensitizing effect reached the uppermost limit when the amount of Michler's ketone added reached about 0.2 g. The minimum exposure step number where the film was left after the development, that is, the sensitivity, was 4.

EXAMPLES 2 THROUGH 16

In Examples 2 through 16, solutions were prepared by changing the amounts and kinds of the aromatic amino compound, aromatic azide compound and sensitizer, and the sensitivities of these solutions were evaluated according to the step tablet method. The obtained results are shown in Table 1.

Incidentally, in Table 1, the content (% by weight) was calculated by dividing the weight of the additive compound by the weight of the polymer and multiplying the quotient by 100.

The preparation of the solutions and the evaluation of the sensitivity were carried out according to the following procedures.

The solution (A) obtained in Example 1 was mixed with diethylaminoethyl methacrylate and then with a solution of an aromatic amino compound (together with an aromatic azide compound and a sensitizer when they were used) in N-methylpyrrolidone, and then the mixture was filtered.

A film was formed on a silicon wafer in the same manner as described in Example 1 by using the thus-obtained solution. A step tablet was closely applied to the film instead of the mask having a stripe pattern, which was used in Example 1, and irradiation with ultraviolet rays was carried out for 10 seconds by using the same mercury lamp as used in Example 1. The minimum step number at which the film was left after the development, that is, the sensitivity, was measured.

TABLE 1

| Example No. | Aromatic Amino Compound (% by weight) | Aromatic Azide Compound (% by weight) | Sensitizer (% by weight) | Sensitivity (step number) |
|---|---|---|---|---|
| 2 | N—phenyldiethanolamine (1.0) | — | — | 5 |
| 3 | N—phenyldiethanolamine (6.4) | — | — | 10 |
| 4 | N—phenyl-N—ethylbenzylamine (6.4) | — | — | 7 |
| 5 | N—phenyl-N—(2-cyanoethyl)-ethylamine (6.4) | — | — | 5 |
| 6 | N—phenyl-morpholine (6.4) | — | — | 5 |
| 7 | N—phenylethanolamine (6.4) | — | — | 10 |
| 8 | N—(3-methylphenyl)diethanolamine (6.4) | — | — | 10 |
| 9 | N—phenyldiethanolamine (1.0) | — | Michler's ketone (1.6) | 9 |
| 10 | N—phenyldiethanolamine (1.0) | *1 (1.6) | — | 9 |
| 11 | N—phenyldiethanolamine (6.4) | *2 (1.0) | — | 10 |
| 12 | N—phenyldiethanolamine (3.2) | *2 (3.2) | — | 9 |
| 13 | N—phenyldiethanolamine (2.0) | *2 (5.0) | — | 10 |
| 14 | N—phenyldiethanolamine (6.4) | *2 (3.2) | — | 12 |
| 15 | N—phenyldiethanolamine (1.6) | *3 (3.2) | — | 9 |
| 16 | N—phenyldiethanolamine (3.2) | *4 (3.2) | Michler's ketone (1.6) | 11 |

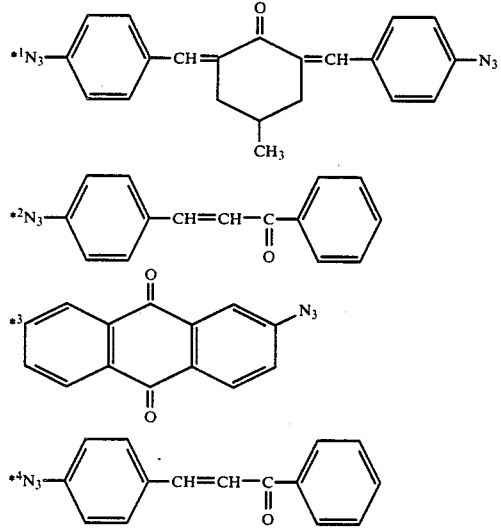

From the results of Examples 2 through 8 shown in Table 1, it is seen that the aromatic secondary or tertiary amino compound has a good sensitivity-improving effect.

From the results of Example 9, it is seen that when the aromatic amino compound is used in a small amount, if Michler's ketone, a typical instance of the known sensitizer, is used in combination, the sensitivity-improving effect is enhanced.

From the results of Examples 10 through 15, it is seen that if the aromatic azide compound is used instead of the known sensitizer, the sensitivity is improved to a level comparable or superior to the level attainable by the combined use of the known sensitizer.

From the results of Example 16, it is seen that when the aromatic amino compound and aromatic azide compound are used together, if Michler's ketone is used in combination, the sensitivity is further improved.

EXAMPLE 17

The polymer solution (A) (40 g) obtained in Example 1 was mixed with 5.6 g of dimethylaminoethyl methacrylate. The mixture was mixed with a solution of 0.2 g of 3-sulfonylazidobenzoic acid and 0.6 g of N-phenyldiethanolamine in 5 g of N-methylpyrrolidone and then the resulting mixture was filtered.

A film was formed on a silicon wafer in the same manner as described in Example 1 by using the thus-formed solution. A mask having a stripe pattern was closely applied to the film and in the same manner as described in Example 1, the assembly was exposed to ultraviolet rays for 4 seconds, followed by development and rinsing, whereby a relief pattern having a sharp end face was obtained. When the relief pattern was heat-treated at 350° C. for 30 minutes, a heat-resistant relief pattern was obtained. Even if this pattern was heat-treated at 200° C. for 1 hour, the pattern did not become obscure or the loss in weight by the heat treatment was not observed.

EXAMPLE 18

A film was formed on a silicon wafer in the same manner as described in Example 1 by using the solution obtained in Example 11.

A pattern was formed by a step-and-repeat type exposure apparatus using rays having a wavelength of 436 nm, and then, development was carried out in the same manner as described in Example 1. When exposure was carried out for 0.5 second, a good pattern was obtained with a film residual ratio of 70%.

The above procedures were repeated in the same manner by using the solution prepared in Comparative Example 1. The film was completely dissolved out and no pattern could be obtained.

We claim:

1. A radiation-sensitive composition comprising:
   (1) a polymer (I) containing repeating units (A) represented by the following formula:

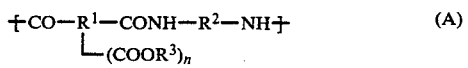

wherein $R^1$ is a trivalent or tetravalent aromatic or heteroaromatic residue having 6 to 30 carbon atoms, $R^2$ is a divalent aromatic or heteroaromatic residue having 6 to 30 carbon atoms, $R^3$ is a hydrogen atom or an ammonium ion, n is a integer of 1 or 2, and $COOR^3$ is located in an ortho or peri position with respect to the amide linkage,
   (2) an organic compound (II) having a radiation-dimerizable or radiation-polymerizable olefinic double bond and an amino radical or a quaternary ammonium salt, and
   (3) an aromatic secondary or tertiary amine compound (III) which is chemically inactive to actinic radiation, said amine compound (III) being at least one compound represented by the following formula:

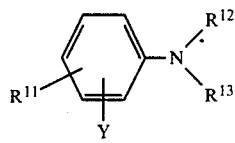

wherein each of $R^{11}$ and $R^{12}$ independently represents a hydrogen atom, a lower alkyl group having 1 to 6 carbon atoms or a lower alkyl group having 1 to 6 carbon atoms which is substituted with a polar group, $R^{13}$ is a lower alkyl group having 1 to 6 carbon atoms or a lower alkyl group having 1 to 6 carbon atoms which is substituted with a polar group, and Y is a hydrogen atom, a hydroxyl group, a nitro group, a lower alkoxy group or a halogen atom.

2. A composition as set forth in claim 1, wherein the polymer [I] contains at least two kinds of repeating units.

3. A composition as set forth in claim 1, wherein "n" in the formula (A) is 2.

4. A composition as set forth in claim 1, wherein $R^1$ is a trivalent or tetravalent aromatic residue of a formula selected from the group consisting of

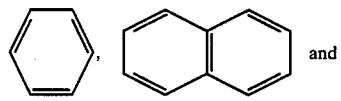

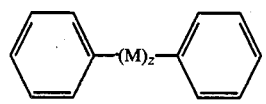

in which M is —O—, —SO$_2$—, —CH$_2$—, $$-\underset{\underset{CH_3}{|}}{\overset{\overset{CH_3}{|}}{C}}-, -\underset{\underset{CF_3}{|}}{\overset{\overset{CF_3}{|}}{C}}- \text{ or } -\underset{\underset{O}{\|}}{C}-$$

and z is 0 or 1.

5. A composition as set forth in claim 1, wherein $R^1$ is an aromatic residue of a formula selected from the group consisting of

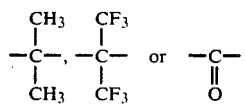

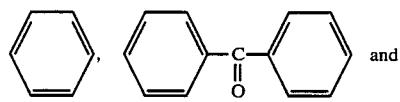

6. A composition as set forth in claim 1, wherein the polymer [I] of the formula (A) contains at least two kinds of $R^2$ groups.

7. A composition as set forth in claim 1, wherein $R^2$ is a divalent aromatic residue selected from the group consisting of a benzene residue, a biphenyl compound residue of the formula:

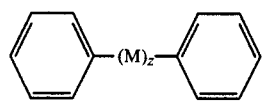

wherein M is —O—, —SO$_2$—, —CH$_2$—, $$-\underset{\underset{CH_3}{|}}{\overset{\overset{CH_3}{|}}{C}}-, -\underset{\underset{CF_3}{|}}{\overset{\overset{CF_3}{|}}{C}}-, -\underset{\underset{CH_3}{|}}{\overset{\overset{CH_3}{|}}{Si}}-O-\underset{\underset{CH_3}{|}}{\overset{\overset{CH_3}{|}}{Si}}-$$

or —CO— and z is an integer of 0 or 1, and a polyphenyl compound residue of the following formula:

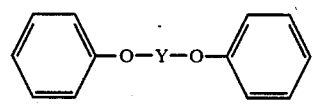

wherein Y is

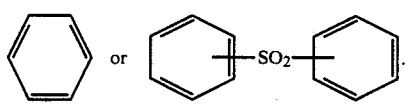

8. A composition as set forth in claim 1, wherein $R^2$ is a divalent aromatic residue of a formula selected from the group consisting of

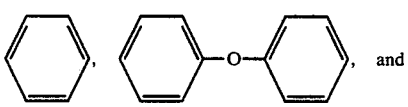

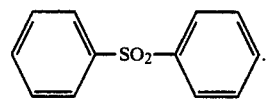

9. A composition as set forth in claim 2, wherein at least one kind of the repeating units contain as $R^2$ an unsubstituted divalent aromatic or heteroaromatic residue and at least one kind of the repeating units contain as $R^2$ a substituted divalent aromatic or heteroaromatic residue.

10. A composition as set forth in claim 1, wherein the compound [II] is at least one compound represented by the following formula:

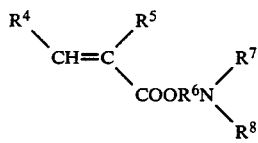

wherein $R^4$ is hydrogen or a phenyl group, $R^5$ is hydrogen or an alkyl group having 1 to 2 carbon atoms, $R^6$ is an alkylene group having 2 to 12 carbon atoms, and each of $R^7$ and $R^8$ is an alkyl group having 1 to 6 carbon atoms.

11. A composition as set forth in claim 1, wherein the compound [II] is at least one compound represented by the following formula:

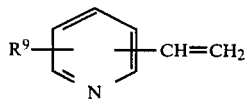

wherein $R^9$ is hydrogen or an alkyl group having 1 to 6 carbon atoms.

12. A composition as set forth in claim 1, wherein the compound [II] is at least one compound represented by the following formula:

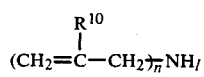

wherein $R^{10}$ is hydrogen or a methyl group, n is an integer of from 1 to 3, and the sum of 1 and n is 3.

13. A composition as set forth in claim 1, wherein the compound [II] is at least one compound selected from the group consisting of diethylaminoethyl methacrylate, diethylaminoethyl acrylate, dimethylaminoethyl methacrylate, dimethylaminoethyl acrylate, 2-vinylpyridine, 2-methyl-5-vinylpyridine, allylamine and methallylamine.

14. A composition as set forth in claim 1, wherein the compound [III] is at least one aromatic amine in which at least one hydrogen atom of the amino radical is substituted with a lower alkyl group having a hydroxyl group.

15. A composition as set forth in claim 1, wherein the compound [III] is at least one compound selected from the group consisting of N-phenylethanolamine, N-phenyl-N-methylethanolamine, N-phenyl-N-ethylethanolamine, N-phenyldiethanolamine, N-(3-methylphenyl)diethanolamine, and N-(4-methylphenyl)diethanolamine.

16. A composition as set forth in claim 1, which further comprises at least one aromatic azide compound.

17. A composition as set forth in claim 16, wherein the aromatic azide compound is at least one compound selected from the group consisting of aromatic monoazide compounds and aromatic bisazide compounds.

18. A composition as set forth in claim 16, wherein the aromatic azide compound is at least one compound selected from the group consisting of:

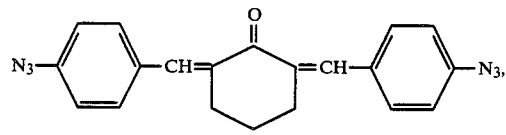

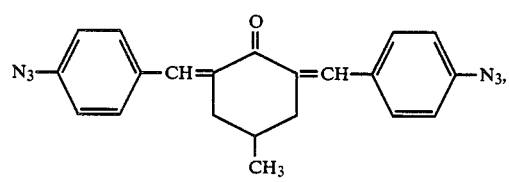

-continued

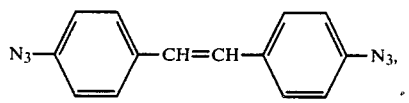

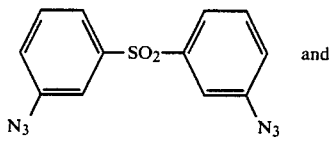

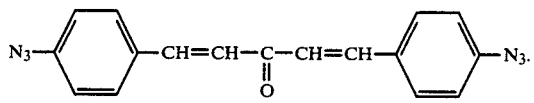

19. A composition as set forth in claim 16, wherein the aromatic azide compound is an aromatic monoazide compound.

20. A composition as set forth in claim 16, wherein the aromatic monoazide compound is at least one compound selected from the group consisting of

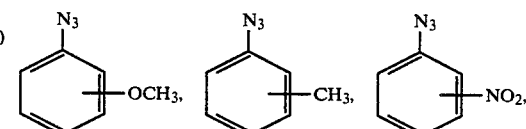

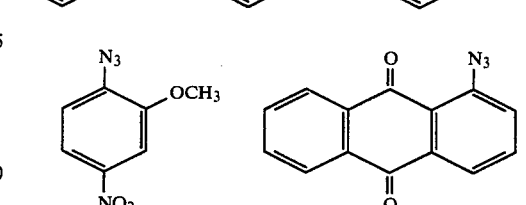

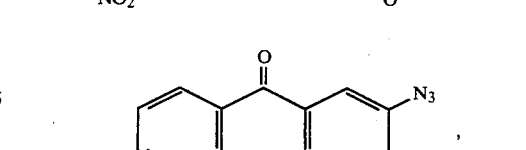

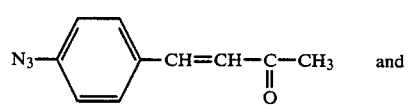

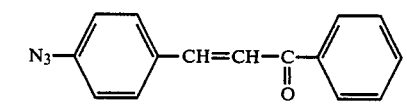

21. A composition as set forth in claim 1, which further comprises at least one aromatic sulfonylazide compound.

22. A composition as set forth in claim 21, wherein the aromatic sulfonylazide compound is at least one compound selected from the group consisting of

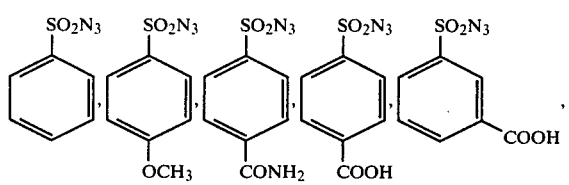
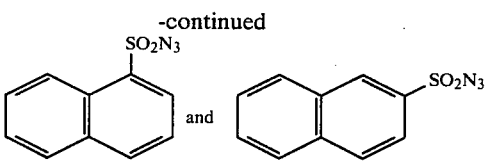
23. A composition as set forth in claim 1, wherein the polar group substitutent in the $R^{11}$, $R^{12}$ and/or $R^{13}$ moieties is a hydroxyl group, a cyano group or a halogen group.
* * * * *